(12) United States Patent
Rodriguez et al.

(10) Patent No.: US 9,516,788 B2
(45) Date of Patent: Dec. 6, 2016

(54) HEAT GENERATING ELECTRIC DEVICE HAVING CARBON NANOTUBE HOUSING AND THERMAL STORAGE MEDIUM

(71) Applicant: Rolls-Royce North American Technologies, Inc., Indianapolis, IN (US)

(72) Inventors: Rigoberto J. Rodriguez, Avon, IN (US); Mark Jon Blackwelder, Plainfield, IN (US)

(73) Assignee: Rolls-Royce North American Technologies, Inc., Indianapolis, IN (US)

( * ) Notice: Subject to any disclaimer, the term of this patent is extended or adjusted under 35 U.S.C. 154(b) by 590 days.

(21) Appl. No.: 13/731,049

(22) Filed: Dec. 30, 2012

(65) Prior Publication Data

US 2013/0169078 A1   Jul. 4, 2013

Related U.S. Application Data

(60) Provisional application No. 61/582,274, filed on Dec. 31, 2011.

(51) Int. Cl.
| | |
|---|---|
| *H02K 9/00* | (2006.01) |
| *H02K 15/12* | (2006.01) |
| *H02K 5/00* | (2006.01) |
| *H05K 7/20* | (2006.01) |
| *H02K 9/22* | (2006.01) |
| *H02K 5/02* | (2006.01) |

(52) U.S. Cl.
CPC .............. *H05K 7/2039* (2013.01); *H02K 5/02* (2013.01); *H02K 9/22* (2013.01); *H05K 7/209* (2013.01)

(58) Field of Classification Search
CPC ................ H01B 1/24; H05K 3/24; H02K 1/00
USPC ......................................... 310/44, 45, 54, 89
See application file for complete search history.

(56) References Cited

U.S. PATENT DOCUMENTS

| | | |
|---|---|---|
| 6,300,695 B1 | 10/2001 | Neal |
| 6,515,383 B1 | 2/2003 | Ognibene et al. |
| 7,566,999 B2 | 7/2009 | Neal |
| 7,583,506 B1 | 9/2009 | Huang et al. |
| 7,629,716 B2 | 12/2009 | Neal |
| 7,723,874 B2 | 5/2010 | Woody et al. |

(Continued)

FOREIGN PATENT DOCUMENTS

| | | | |
|---|---|---|---|
| CN | 102010690 A | * | 4/2011 |
| JP | 2004304980 A | * | 10/2004 |
| WO | WO 2008133786 A1 | * | 11/2008 |

OTHER PUBLICATIONS

Machine Translation JP2004304980 (2004) and CN102010690 (2011).*

*Primary Examiner* — Jose Gonzalez Quinones
(74) *Attorney, Agent, or Firm* — Shumaker & Sieffert, P.A.

(57) ABSTRACT

An electric device is disclosed capable of generating heat during operation. The electric device can be in thermal communication to dissipate the heat through the use of carbon nanotubes and/or a phase change material. In one form the electric device includes a housing that has the carbon nanotubes. The housing, furthermore, can be a composite that in some embodiments does not provide as effective heat transfer as the carbon nanotubes. The electric device can take the form of a power electronic device in some embodiments and a device having a rotor and stator in others. Such embodiments include motors and/or generators.

12 Claims, 3 Drawing Sheets

(56) References Cited

U.S. PATENT DOCUMENTS

| | | | |
|---|---|---|---|
| 2005/0082921 A1* | 4/2005 | Schurter | H02K 1/185 310/58 |
| 2006/0255678 A1* | 11/2006 | Du | H01R 43/10 310/156.43 |
| 2007/0103011 A1 | 5/2007 | Neal | |
| 2008/0012436 A1 | 1/2008 | Neal | |
| 2009/0260781 A1 | 10/2009 | Ullman et al. | |
| 2010/0132915 A1 | 6/2010 | Blanding | |
| 2010/0188833 A1* | 7/2010 | Liang et al. | 361/818 |

* cited by examiner

HEAT GENERATING ELECTRIC DEVICE HAVING CARBON NANOTUBE HOUSING AND THERMAL STORAGE MEDIUM

CROSS REFERENCE TO RELATED APPLICATIONS

The present application claims the benefit of U.S. Provisional Patent Application 61/582,274, filed Dec. 31, 2011, and is incorporated herein by reference.

TECHNICAL FIELD

The present invention generally relates to electric devices that generate heat during operation, and more particularly, but not exclusively, to devices used to cool the electric devices.

BACKGROUND

Providing adequate heat transfer from an electric device that generates heat during operation remains an area of interest. Some existing systems have various shortcomings relative to certain applications. Accordingly, there remains a need for further contributions in this area of technology.

SUMMARY

One embodiment of the present invention is a unique approach to transferring heat from a heat producing electric component. Other embodiments include apparatuses, systems, devices, hardware, methods, and combinations for withdrawing heat from an electric component. Further embodiments, forms, features, aspects, benefits, and advantages of the present application shall become apparent from the description and figures provided herewith.

DETAILED DESCRIPTION OF THE ILLUSTRATIVE EMBODIMENTS

Figure 1:
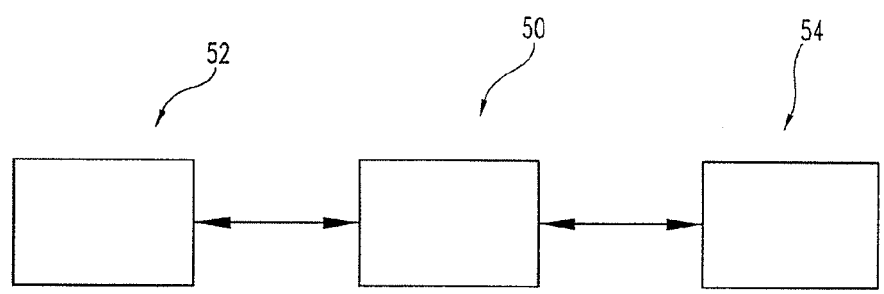
FIG. 1 depicts an embodiment of an electric device in communication with other devices.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

With reference to FIG. 1, an electrical device 50 is shown in power communication with devices 52 and 54 and, when operated, generates heat as a byproduct of being in power communication with the devices. The electrical device 50 can take a variety of forms such as power electronics and electric motors, generators, or motor generators, variations and arrangements of which will be described further below. In general the electrical device 50 can include any electrically powered device that generates heat as a result of the electrical operation of the device, the heat of which if not dissipated can in some cases lead to a deterioration in stability and/or performance of the electrical device or even outright failure.

The devices 52 and 54 can be configured to provide power, receive power, or provide and receive power from the electrical device 50. The devices 52 and 54 can take a variety of forms including, but not limited to, generators, batteries, mechanical shafts, internal combustion engines, etc. In one non-limiting example, the device 52 can be a gas turbine engine that provides mechanical power to the electrical device 50, in the form of a generator, that in turn provides power to the device 54 in the form of an aircraft power consuming device such as a display. In yet another non-limiting example, the electrical device 50 can be a power electronics device that receives an electrical source from device 54, operates upon it, and delivers it to device 52. Such a device can be used to modify, convert, transfer, etc. an electrical signal or power from one device to another. Examples include rectifiers, inverters, and converters. The power electronics can include switching elements and in some forms are configured as high power electronic devices. Other combinations and variations of the devices 52 and 54, as well as their interactions with the electrical device 50 are contemplated.

As used herein, the term "aircraft" includes, but is not limited to, helicopters, airplanes, unmanned space vehicles, fixed wing vehicles, variable wing vehicles, rotary wing vehicles, unmanned combat aerial vehicles, tailless aircraft, hover crafts, and other airborne and/or extraterrestrial (spacecraft) vehicles. Further, the present inventions are contemplated for utilization in other applications that may not be coupled with an aircraft such as, for example, industrial applications, power generation, pumping sets, naval propulsion, weapon systems, security systems, perimeter defense/security systems, and the like known to one of ordinary skill in the art.

Figure 2:
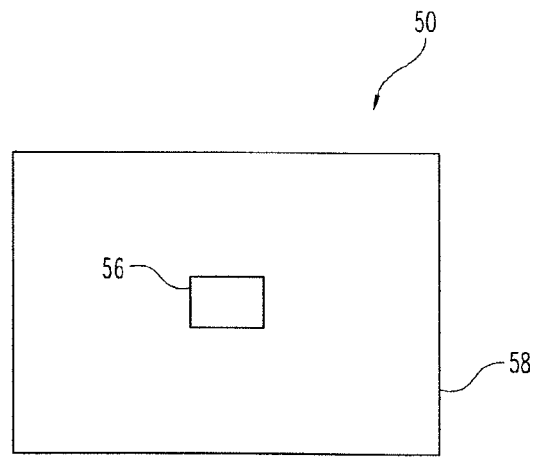
FIG. 2 depicts an embodiment of an electric device and a housing.

FIG. 2 depicts one embodiment of the electrical device 50 that includes a power component 56 that is enclosed by a housing 58. The housing 58 can enclose one or more portions of the power component 56, and in some forms the housing 58 can completely or only partially enclose the power component 56. To set forth just one non-limiting example, the housing 58 can have one or more openings through which can pass cabling, cooling air, etc. In some forms the power component 56 can be coupled to a base upon which the housing 58 is attached to enclose the power component 56. In other forms the housing 58 can be a cover plate which is attached to a structure that primarily encloses the power component 56. In this way the housing 58 is understood to mean any structure that by itself or in cooperation with other structure can be used to enclose the power component 56. In some applications two or more parts that enclose the power component 56 can be referred to as the housing 58. The housing 58 can have faceted surfaces such as, but not limited to, rectilinear sides that form a box having an open bottom into which is received the power component 56. In some forms the housing 58 can have curvilinear sides that provide convex or concave surfaces which form a boundary to enclose the power component 56, whether the boundary is on an external or internal side of the power component 56.

The housing 58 can be in a heat transfer relationship with the power component 56 such as through conduction, convection, or radiation. Accordingly, in these forms the housing 58 can assist in transferring heat generated from the power component 56 to a region external to the electric device 50. The housing 58, or one or more portions thereof, can be made out of a variety of materials/constituents/etc, some of which in certain embodiments promote heat transfer better than others. In one form the housing 58 includes a construction that has limited heat transfer capabilities but that also includes materials such as carbon nanotubes that improve thermal transfer properties. In one non-limiting example the housing 58 is a composite construction that includes carbon nanotubes. In some forms the composite may be made of one or more materials and/or construction with limited ability to transfer heat but that the addition of the carbon nanotubes improves the heat transfer capabilities of the composite.

The carbon nanotubes used in the construction of the housing or other components of the electrical device 50, as well as the composite construction itself, can take a variety of forms. For example, the carbon nanotubes can have a variety of morphology and properties that can be consistent throughout the composite construction or can vary. The carbon nanotubes can in any given application be single walled or multi-walled tubes; they can be zigzag, armchair, and chiral nanotubes, and can exhibit any variety of thermal and structural properties. The nanotubes or composition of nanotubes used in any given construction can be tailored to target a region of thermal conductivity but other properties can also be tailored. The housing or other component having the carbon nanotubes can also include a range of density of the nanotubes depending on the application. In some forms the density of nanotubes can change depending on location in the electrical device 50. Furthermore, the carbon nanotubes can be randomly disbursed in the composite housing or other component, or can be ordered and/or aligned in a given direction. In one form the housing includes a portion(s) having carbon nanotubes that have been aligned along the thickness of the housing.

The composite construction that includes the nanotubes can be made using a variety of approaches. In some forms the nanotubes can be mixed with a liquid material that can be solidified to a final shape. To set forth just a few non-limiting examples, the nanotubes can be mixed/dispersed/etc. into a thermoplastic material, a polymer precursor that is polymerized with an initiator, a thermoplastic polymer solution, etc. Furthermore, the composite construction having the carbon nanotubes can be formed into layers through deposition or otherwise and coupled with a substrate or other layers, the construction can be extruded into shape, among other possible processing steps. In addition, the composite can be physically manipulated in size and/or shape to achieve a desired effect. In short, any variety of suitable approaches for producing composite housing having the carbon nanotubes is contemplated herein.

Alternatively and/or additionally to the techniques for transferring heat described above using composite constructions having carbon nanotubes, the electrical device 50 can be cooled through heat transfer mechanisms such as a thermal storage device. The thermal storage device can operate on basis of a phase change of a thermal material, like wax, etc. References made herein to phase change materials are non-limiting examples of thermal storage devices unless stated to the contrary. In one non-limiting embodiment the electrical device 50 can be coupled with a phase change material that can absorb heat generated from the electrical device 50. The phase change material can be coupled in a variety of locations to an electrical device 50 such as to individual components of the electrical device.

Figure 3:
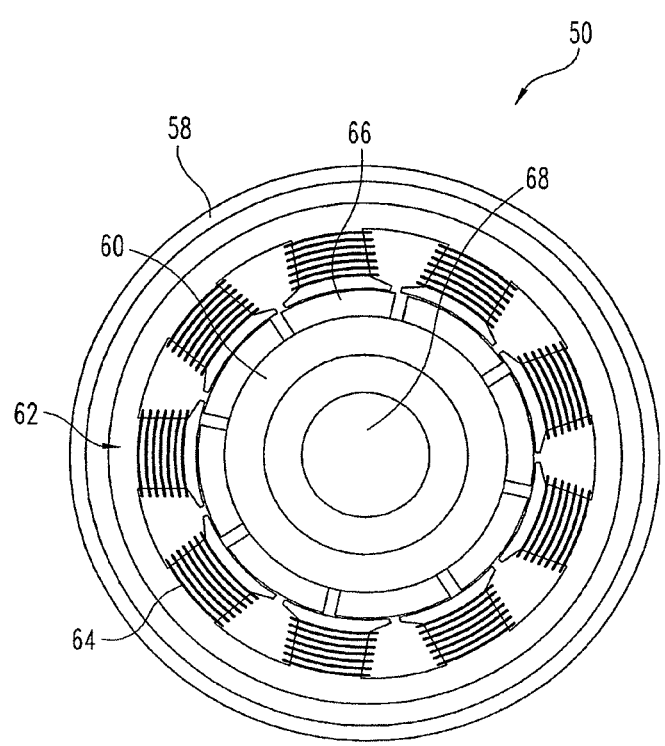
FIG. 3 depicts one embodiment of an electric device having a rotor and a stator.

Turning now to FIG. 3, the electric device 50 is in the form of an electric machine having a rotor 60 and a stator 62. The electric machine of the illustrated embodiment can be used to generate electricity upon receipt of a power to mechanically rotate the rotor 60, and additionally and/or alternatively can be used to generate a mechanical power through the rotor by excitation of the stator 62. For convenience the electric device will be subsequently referred to as a motor/generator but nothing is intended in the discussion to limit the device to a machine capable of performing both as a motor and as a generator. It will be understood that the description that follows to transfer heat from the electric machine is equally applicable to those configurations that function as only a motor or as a generator.

In one form the stator 62 includes a plurality of conductive windings 64 which interact with a magnetic field from a permanent magnet 66 affixed to rotate with the rotor 60. The windings of the stator 62 can be of various configurations, cross-sections, and geometries, among other attributes, that can include, but not be limited to, drum windings, lap windings, wave windings, among others. To set forth just a few more non-limiting attributes, the electric device 50 can be configured to have separately excited windings, straight shunt windings, series windings, and possible combinations thereof, among potential others. In one form of operation, a rotating magnetic field caused by the rotor 60 can be used to induce a current in the conductive windings 64. In another form of operation a current through the conductive windings 64 can generate a magnetic field which interacts with the magnetic field of the permanent magnet(s) 66 to induce a rotation of the rotor. The permanent magnet of the rotor can be a plurality of magnets arranged in a variety of configurations. In some forms the rotor can be a wound-rotor configuration. Various other embodiments of motor/generators are contemplated herein.

The operation of the motor/generator of FIG. 3 can produce heat which can be dissipated through any of the techniques described above, either alone or in combination. For example, the electric machine depicted in the figure can be cooled through the use of a phase change material 68 located internal to the rotor 60, and/or through a composite housing having carbon nanotubes.

The phase change material can be any suitable composition for the application intended. For example, when the electric machine is not operated the composition can be selected to be in a solid state or liquid state which can change phase when the electric machine is in operation. In one form the phase change material can be a solid at a non-operating status and be configured relative to heat generating components of the electric machine to receive heat and transition to liquid state during operation. The phase change material can transition fully between states during an operation or can transition only partly.

The housing 58 of the illustrated embodiment in FIG. 3 can also be constructed using carbon nanotubes as described above.

Figure 4:
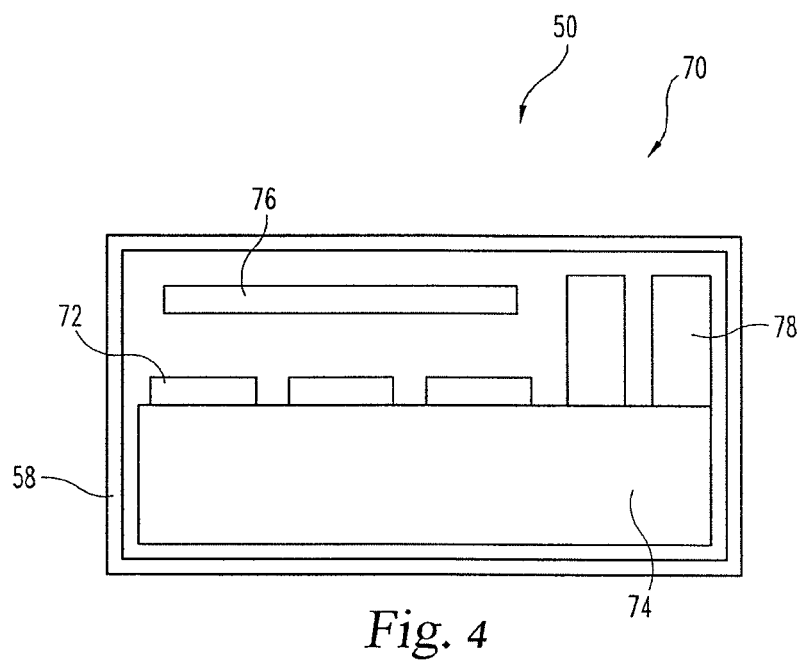
FIG. 4 depicts an embodiment of an electric device in the form of power electronics.

Turning now to FIG. 4, one embodiment of the electric device 50 in the form of power electronics 70 is shown having both a composite outer housing 58 the can include carbon nanotubes as well as an electric component 72 in thermal relationship with a phase change material 74. The housing 58 and phase change material 74 can have any number of attributes/variations/etc, some of which are described above. The power electronics 70 can include a control 76, passive elements 78, and switching elements 72.

The phase change material 74 and housing 58 can be in thermal communication with any or all of the elements of the power electronics 70. As depicted in the illustrated embodiment, various forms of the electric device 50 can include the phase change material in thermal communication with the housing.

To set forth just a few more non-limiting embodiments that use various of the heat transfer approaches described above, in one form the electric device 50 can take the form of a motor generator that uses a composite construction housing having carbon nanotubes. The housing can be an external housing or a structure acting as a housing for any of the constituent parts of the motor generator. For example, the stator can be enclosed either partially and/or fully inside of a housing having a composite construction with carbon nanotubes as it is configured relative to the rotor of the motor generator. In another non-limiting alternative and/or additional embodiment the electric device 50 can include a phase change material. In still a further alternative and/or additional form, the electric device 50 can have a phase change material disposed internal to its rotatable rotor that also acts to transfer heat. The housing 58 and phase change material can have any number of attributes/variations/etc., some of which are described above.

If needed, in some forms the housing 58 can also include materials that provide an enhanced electromagnetic interference/radiofrequency interference (EMI/RFI) property relative to a composition of the housing that does not include the materials.

One aspect of the present application provides an apparatus comprising an electric power device having a heat generating electric component and a housing that at least partially envelops the heat generating electric component and oriented to conduct a heat from the heat generating electric component, the housing being of a composite construction that includes a plurality of carbon nanotubes useful to dissipate a thermal energy produced from the heat generating electric component.

A feature of the present application provides wherein the heat generating electric component is in thermal conductive relation with the housing.

Another feature of the present application provides wherein the composite construction is a polymer based composite having the plurality of carbon nanotubes.

Still another feature of the present application provides wherein the composite construction is a carbon nanotube reinforced polymer.

Yet still another feature of the present application provides wherein the composite construction is doped to include an electromagnetic material.

Still yet another feature of the present application provides wherein the electric power device further includes a thermal storage device.

A further feature of the present application provides wherein the electric power device is an electric device having a rotor and a stator.

A still further feature of the present application provides wherein the thermal storage device is located radially inward from the stator.

Another aspect of the present application provides an apparatus comprising an electric machine operable to generate a heat during operation as a stator and a rotating component interact with each other, the rotating component having an inner space within which is disposed a phase change thermal storage medium capable of changing phase when heat is generated by the stator and rotating component, the change of phase operable to absorb the heat.

A feature of the present application provides wherein the electric machine further includes a composite housing.

Another feature of the present application provides wherein the composite housing includes a carbon nanotube.

Yet another feature of the present application provides wherein the composite housing includes a thermoplastic material.

Still yet another feature of the present application provides wherein the electric machine includes a housing having a carbon nanotube.

Yet a further feature of the present application provides wherein the housing further includes a material to mitigate EMI/RFI.

Still another aspect of the present application provides a method comprising generating a heat as a result of operation of an electric device, and dissipating the heat through a carbon nanotube array located within a housing of the electric device.

A feature of the present application provides wherein the housing is a composite construction and the dissipating is substantially through the carbon nanotube array.

Another feature of the present application further includes absorbing a heat in a thermal storage device in thermal communication with the electric device.

Yet another feature of the present application further includes rotating a rotor of the electric device, and receiving a heat in a phase change material located in the rotor.

A still further aspect of the present application provides a method comprising rotating a component of an electric device, producing a heat as a result of the rotating the component, and absorbing the heat through a rotor of the electric device and into in a thermal storage device located internal to the rotor.

A feature of the present application further includes changing a phase of the thermal storage device as a result of the absorbing.

Another feature of the present application further includes transferring heat through a carbon nanotube in thermal communication with the electric device.

Yet another feature of the present application provides wherein the carbon nanotube is embedded in a housing of the electric device, and which further includes substantially discouraging transfer of heat through the housing except through the carbon nanotube.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. An apparatus comprising:
an electric device including a heat generating electric component, a thermal storage device, and a housing, the housing being structured to at least partially envelop the heat generating electric component and being of a composite construction that includes a plurality of carbon nanotubes useful to dissipate thermal energy produced from the heat generating electric component, and the thermal storage device including a phase change material operative to at least partly change from a first phase to a second phase to cool the electric device, wherein the electric device includes a stator and a rotor that includes a plurality of magnets, and wherein the phase change material is located internal to the rotor and not radially outward of the plurality of magnets of the rotor.

2. The apparatus of claim 1, wherein the heat generating electric component is in thermal conductive relation with the housing.

3. The apparatus of claim 1, wherein the composite construction is a polymer based composite having the plurality of carbon nanotubes.

4. The apparatus of claim 3, wherein the composite construction is a carbon nanotube reinforced polymer.

5. The apparatus of claim 1, wherein the composite construction is doped to include an electromagnetic material.

6. An apparatus comprising:
an electric machine including a housing, a stator, and a rotor, the electric machine being operable to generate thermal energy as the stator and the rotor interact with each other, the rotor defining an inner space within which is disposed a phase change thermal storage medium operable to change from a first phase to a second phase in response to generation of the thermal energy from interaction between the stator and the rotor, the change from the first phase to the second phase being operable to cool the electric machine, the housing containing at least a portion of the electric machine, and the housing being constructed from a composite including a plurality of carbon nanotubes operable to dissipate heat from the electric machine, wherein the rotor includes a plurality of magnets, and wherein the phase change material is not radially outward of the plurality of magnets of the rotor.

7. The apparatus of claim 6, wherein the composite includes a thermoplastic material.

8. The apparatus of claim 6, wherein the housing further includes a material to mitigate EMI/RFI.

9. A method comprising:
generating a heat as a result of operation of an electric device including a stator and a rotor that includes a plurality of magnets;
dissipating at least a portion of the heat through a carbon nanotube array located within a housing of the electric device; and
absorbing thermal energy generated with the electric device by changing a phase change material from a first phase to a second phase, the phase change material being contained within a thermal storage device in thermal communication with the electric device, wherein the phase change material is located internal to the rotor and not radially outward of the plurality of magnets of the rotor.

10. The method of claim 9, wherein the housing is a composite construction and the dissipating is substantially through the carbon nanotube array.

11. The method of claim 9, which further includes rotating a rotor of the electric device, the phase change material being at least partly contained in the rotor.

12. A method comprising:
rotating a component of an electric device;
producing a heat as a result of the rotating of the component;
absorbing the heat through a rotor of the electric device, the rotor including a thermal storage device containing a phase change material, the phase change material changing from a first phase to a second phase in response to the heat, wherein the phase change material is located internal to the rotor and not radially outward of the plurality of magnets of the rotor; and
transferring thermal energy through carbon nanotubes located in a housing that at least partly encloses the component of the electric device.

* * * * *

UNITED STATES PATENT AND TRADEMARK OFFICE
CERTIFICATE OF CORRECTION

PATENT NO.      : 9,516,788 B2
APPLICATION NO. : 13/731049
DATED           : December 6, 2016
INVENTOR(S)     : Rigoberto J. Rodriguez et al.

It is certified that error appears in the above-identified patent and that said Letters Patent is hereby corrected as shown below:

In the Claims

Column 8, Line 27/28 (Claim 11): "a rotor of the electric device, the phase change material being at least partly contained in the rotor." should read --a rotor of the electric device.--

Signed and Sealed this
Twenty-third Day of May, 2017

Michelle K. Lee
*Director of the United States Patent and Trademark Office*